United States Patent
Coman

(10) Patent No.: US 7,344,266 B2
(45) Date of Patent: Mar. 18, 2008

(54) PORTABLE RADIAL PROJECTION LIGHT SOURCE ARRANGEMENT

(76) Inventor: Perry Coman, 38240 Pine Creek Pl., Murrieta, CA (US) 92582

( * ) Notice: Subject to any disclaimer, the term of this patent is extended or adjusted under 35 U.S.C. 154(b) by 0 days.

(21) Appl. No.: 11/321,983

(22) Filed: Dec. 28, 2005

(65) Prior Publication Data

US 2006/0104054 A1    May 18, 2006

Related U.S. Application Data

(63) Continuation-in-part of application No. 10/699,027, filed on Nov. 3, 2003, now Pat. No. 7,111,958.

(51) Int. Cl.
*E01F 9/00* (2006.01)
(52) U.S. Cl. .................... 362/153.1; 362/153
(58) Field of Classification Search .............. 362/153.1
See application file for complete search history.

(56) References Cited

U.S. PATENT DOCUMENTS

| | | | | |
|---|---|---|---|---|
| 1,877,785 | A * | 9/1932 | Andrews | 362/186 |
| 3,264,463 | A * | 8/1966 | Bonner, Jr. | 362/158 |
| 3,634,675 | A * | 1/1972 | Madsen et al. | 362/303 |
| 5,105,347 | A * | 4/1992 | Ruud et al. | 362/268 |
| 5,113,325 | A * | 5/1992 | Eisenbraun | 362/103 |
| 5,559,510 | A * | 9/1996 | Strong et al. | 340/954 |
| 5,608,290 | A * | 3/1997 | Hutchisson et al. | 315/200 A |
| 5,676,448 | A * | 10/1997 | Urbaing | 362/153.1 |
| 6,364,506 | B1 * | 4/2002 | Gallo | 362/245 |
| 6,533,446 | B2 * | 3/2003 | Chen et al. | 362/559 |
| 6,543,911 | B1 * | 4/2003 | Rizkin et al. | 362/307 |
| 6,554,441 | B2 * | 4/2003 | Rohlfing et al. | 362/35 |
| 6,623,140 | B2 * | 9/2003 | Watterson et al. | 362/184 |
| 6,637,921 | B2 * | 10/2003 | Coushaine | 362/517 |
| 6,679,618 | B1 * | 1/2004 | Suckow et al. | 362/247 |
| 6,755,556 | B2 * | 6/2004 | Gasquet et al. | 362/329 |
| 6,932,496 | B2 * | 8/2005 | Rizkin et al. | 362/299 |
| 7,083,315 | B2 * | 8/2006 | Hansler et al. | 362/559 |
| 2005/0068777 | A1 * | 3/2005 | Popovic | 362/307 |

* cited by examiner

*Primary Examiner*—Hargobind S. Sawhney
(74) *Attorney, Agent, or Firm*—Raymond Y. Chan; David and Raymond Patent Firm

(57) ABSTRACT

A portable radial projection light source arrangement includes a shelter housing and an illumination unit. The shelter housing includes a protection base having a light source cavity therein, and a supporting frame mounted on the protection base. The illumination unit includes a power source supported in the protection base, a light source disposed in the light source cavity and electrically connected to the power source, and a reflecting member supported at a position coaxially above the light source wherein the reflecting member has a light reflecting surface radially projected from the light source in such a manner that when the light source emits light, the light is radially reflected by the light reflecting surface of the reflecting member to outside.

4 Claims, 9 Drawing Sheets

PORTABLE RADIAL PROJECTION LIGHT SOURCE ARRANGEMENT

CROSS-REFERENCE OF RELATED APPLICATION

This is a Continuation-In-Part application of a non-provisional application having an application Ser. No. 10/699,027 and a filing date of Nov. 3, 2003, now U.S. Pat. No. 7,111,958.

BACKGROUND OF THE PRESENT INVENTION

1. Field of Invention

The present invention relates to a light source arrangement, and more particularly to a portable radial projection light source arrangement, wherein the light is radially projected from a light source to outside and is visible from great distances so that the portable radial projection light source arrangement functions as a road flare for quick use in an emergency.

2. Description of Related Arts

At an incident, such as a traffic accident, an individual usually distributes a plurality of road flares on the road as a temporary divider on a roadway. In other words, the road flares alert other drivers that there is an accident in front so as to separate the accident from the roadway.

Accordingly, one of the most common road flares is the ignition type disposable flare wherein the flare is simply ignited and directly disposed on the roadway. However, such a conventional flare has several drawbacks. One of the biggest is the danger of fire due to high winds or flammable liquids at the scene. Since the flare must be held by a user, such as a policeman, while burning and dropped on the roadway to form the temporary divider, there is a possibility of a burn to the user or even his or her clothes while the user holds the burning flare. In addition, the flare may damage the surface of the roadway when the flare is placed thereon since the heat produced by the flare may melt or scar the roadway and the residue of the flare will remain on the roadway when the flare is used.

Furthermore, when the flare is burning, the light is produced to radially project from an ignition head of the flare to outside. Since the driver is positioned on the roadway away from the flare, the driver can only see the light projecting sideward from the flare. Therefore, the light projecting upwardly from the flare cannot enhance the visibility of the flare. Thus, since the flare, it is a waste of energy since the flare produces not only light but also heat while burning. As a result, the heat and the upward projecting light will minimize the effective of the flare.

Moreover, the usable time of the flare depends on the burning rate of the flare. If the policemen finish their duty before the flare is used up, the flare must be left on the roadway until the flare is totally burnt. If the policemen require longer time to take care of the accident, they must ignite another flare in order to keep the temporary divider wherein it is unreasonable that the flare still remains on the roadway when the accident is cleared. Therefore, the time usage of the flare is not controlled by the user.

SUMMARY OF THE PRESENT INVENTION

A main object of the present invention is to provide a portable radial projection light source arrangement, wherein the light is radially projected from a light source to outside and is visible from great distances so that the portable radial projection light source arrangement functions as a road flare for quick use in an emergency.

Another object of the present invention is to provide a portable radial projection light source arrangement, wherein a reflecting member is positioned above the light source so that the light emitted from the light source is reflected by the reflecting member to radially project to outside. Therefore, the light is concentrated in a radial direction to highly enhance the visibility of the light source arrangement.

Another object of the present invention is to provide a portable radial projection light source arrangement, wherein the light source is powered by a replaceable or rechargeable battery to prolong the service life span thereof. In other words, the portable radial projection light source arrangement is re-usable so as to minimize the cost of the present invention.

Another object of the present invention is to provide a portable radial projection light source arrangement, wherein the operation temperature the light source is very low, i.e. less than 10° C., so as to minimize the waste of energy to produce the heat. In addition, the user is safe to touch the light source arrangement without the possibility of a burn to the user.

Another object of the present invention is to provide a portable radial projection light source arrangement, wherein the light source is protected by a durable outer shelter housing so as to prevent the light source from being damaged while the vehicle runs over the present invention.

Another object of the present invention is to provide a portable radial projection light source arrangement, wherein the light source is capable of not only producing different colors of light, such as white, red, green, or blue, but also providing various light effect, such as flashing, so as to enhance the visibility of the portable radial projection light source arrangement.

Another object of the present invention is to provide a portable radial projection light source arrangement, no expensive or complicated structure is required to employ in the present invention in order to achieve the above mentioned objects. Therefore, the present invention successfully provides an economic and efficient solution for alert illumination purpose.

Accordingly, in order to accomplish the above objects, the present invention provides a portable radial projection light source arrangement, comprising:

a shelter housing comprising a protection base having a light source cavity therein, and a supporting frame mounted on the protection base; and an illumination unit comprising a power source supported in the protection base, a light source disposed in the light source cavity and electrically connected to the power source, and a reflecting member supported by the supporting frame at a position coaxially above the light source wherein the reflecting member has a light reflecting surface radially projected from the light source in such a manner that when the light source emits light, the light is radially reflected by the light reflecting surface of the reflecting member to outside.

These and other objectives, features, and advantages of the present invention will become apparent from the following detailed description, the accompanying drawings, and the appended claims.

DETAILED DESCRIPTION OF THE PREFERRED EMBODIMENT

Figure 1:
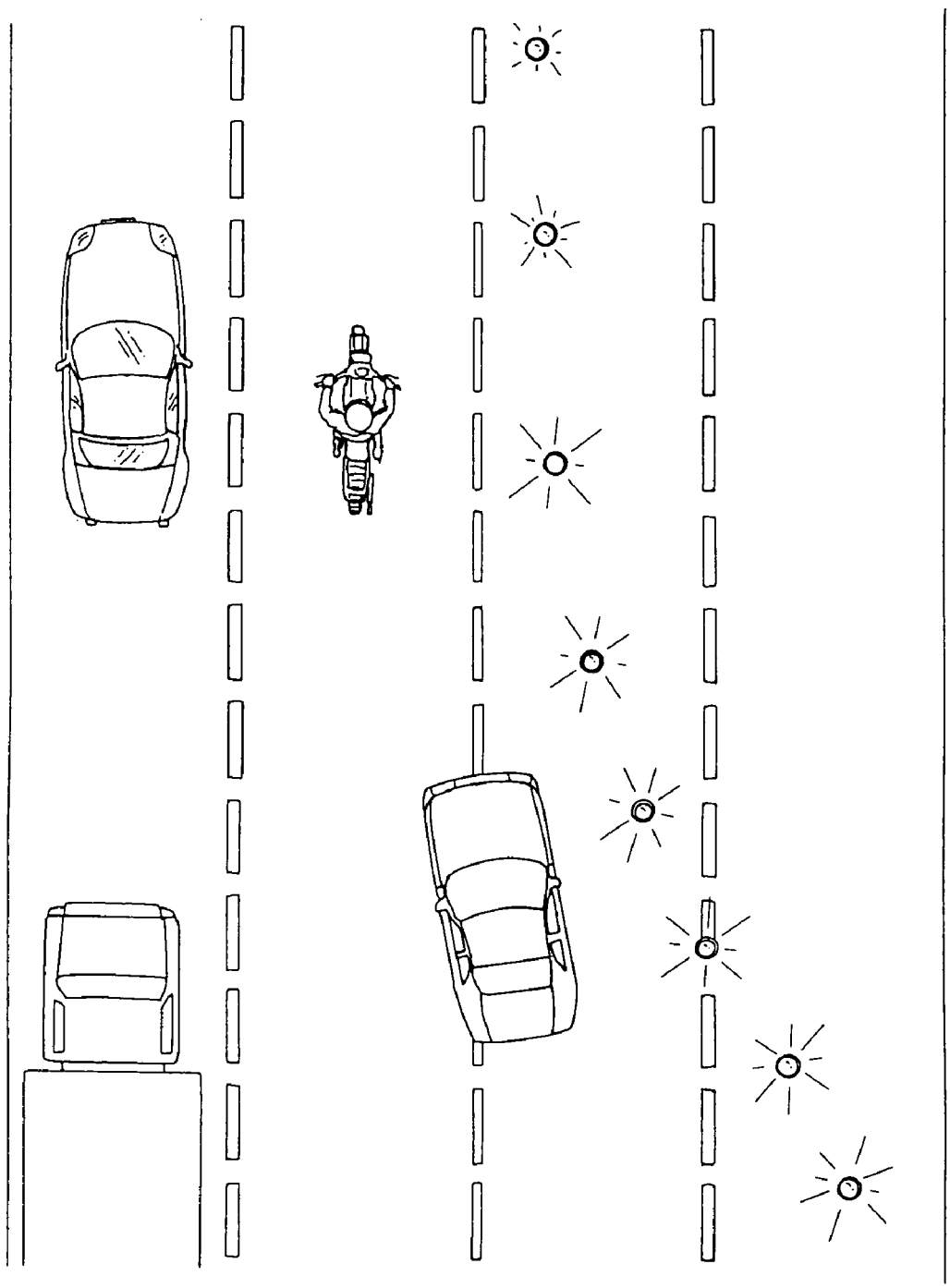
FIG. 1 illustrates the use of a portable radial projection light source arrangement as a road flare for forming a temporary divider on a roadway according to a first preferred embodiment of the present invention.

Referring to FIGS. 1 through 5 of the drawings, a portable radial projection light source arrangement according to a preferred embodiment of the present invention is illustrated, wherein the portable radial projection light source arrangement is capable of functioning as a road flare to form a temporary divider on a roadway, as shown in FIG. 1.

Figure 3:
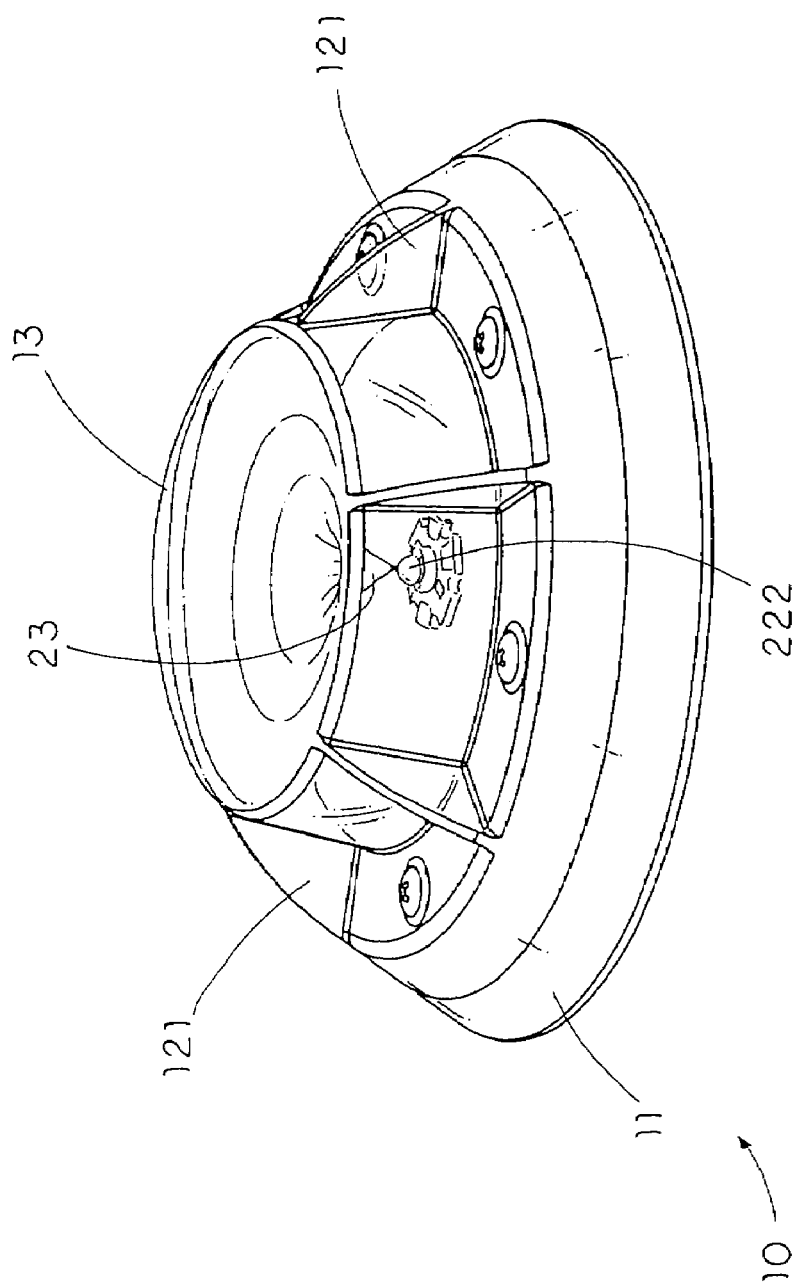
FIG. 3 is a perspective view of a portable radial projection light source arrangement according to the above first preferred embodiment of the present invention.
Figure 4:
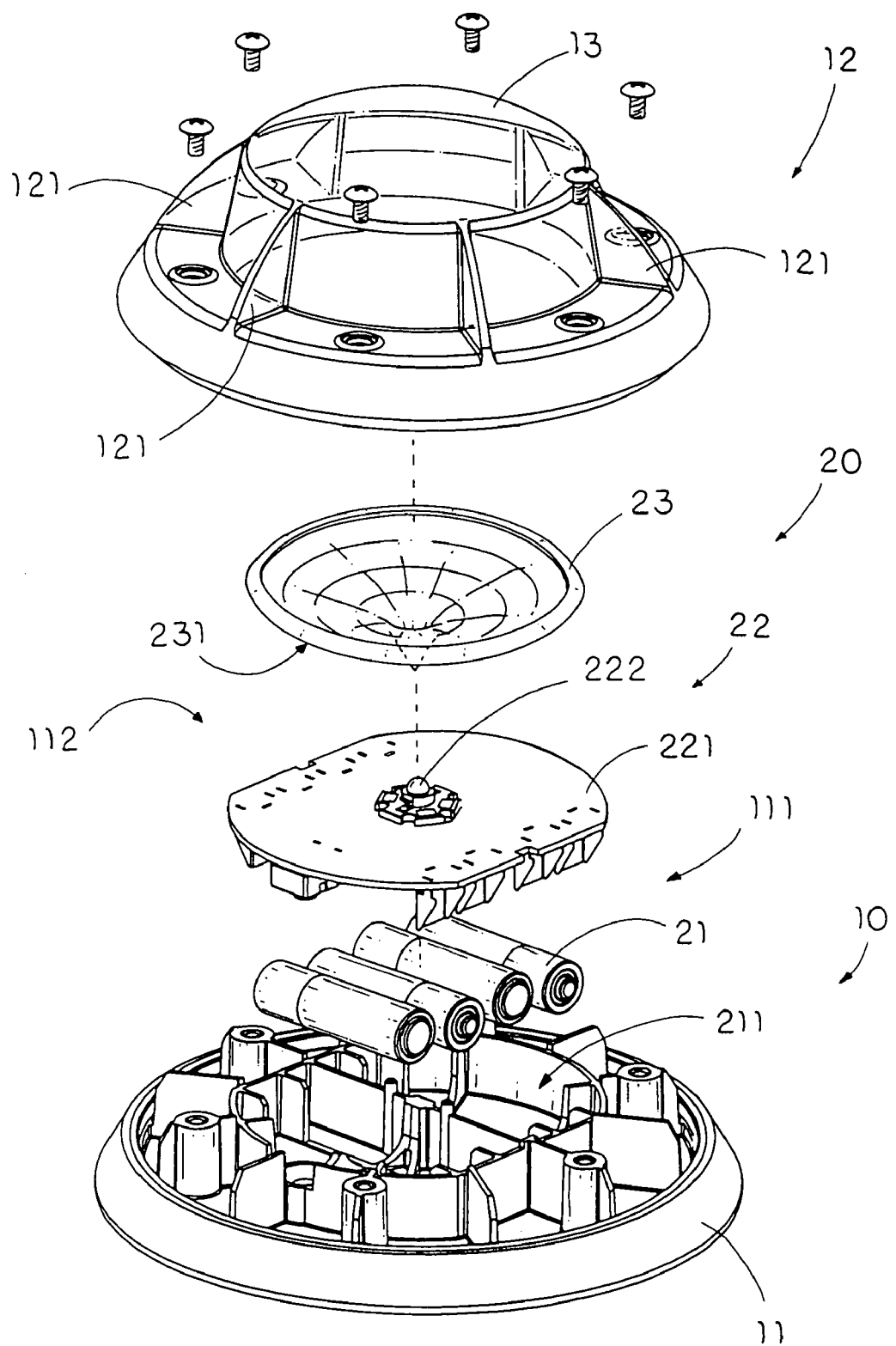
FIG. 4 is an exploded perspective view of the portable radial projection light source arrangement according to the above first preferred embodiment of the present invention.
Figure 5:
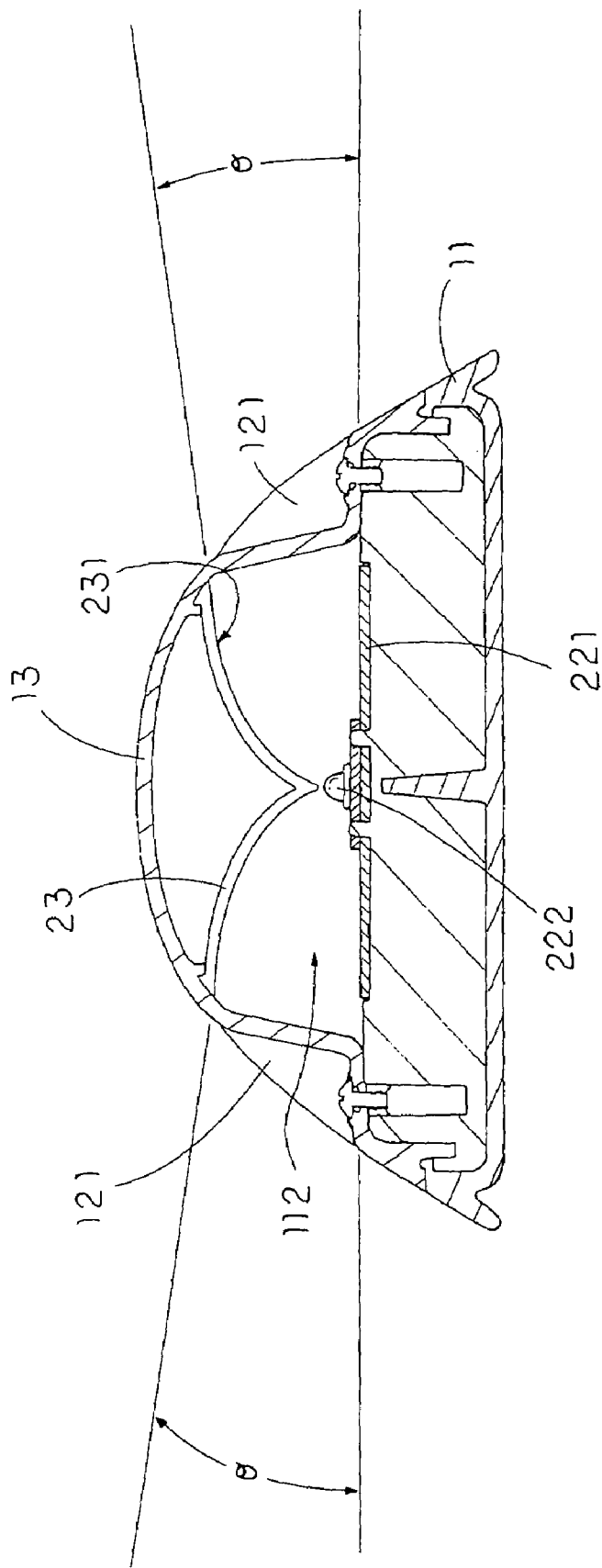
FIG. 5 is a sectional view of the portable radial projection light source arrangement according to the above first preferred embodiment of the present invention.

As shown in FIGS. 3 and 4, the portable radial projection light source arrangement comprises a shelter housing 10 and an illumination unit 20, wherein the shelter housing 10 comprises a protection base 11 having a light source cavity 111 therein, and a supporting frame 12 mounted on the protection base 11.

The illumination unit 20 comprises a power source 21 supported in the protection base 11, a light source 22 disposed in the light source cavity 111 and electrically connected to the power source 21, and a reflecting member 23 supported by the supporting frame 12 at a position coaxially above the light source 22 wherein the reflecting member 23 has a light reflecting surface 231 radially projected from the light source 22 in such a manner that when the light source 22 emits light, the light is radially reflected by the light reflecting surface 231 of the reflecting member 23 to outside.

According to the preferred embodiment, the protection base 11 of the shelter housing 10, having a circular dish shape, further has a light chamber 112 wherein the light source cavity 111 is provided at a center of the light chamber 112. The protection base 11 is made of durable material such that when the light source 22 is received in the light source cavity 111, the protection base 11 protects the light source 22, so as to prevent the light source 22 from being damaged when a vehicle runs over the portable radial projection light source arrangement of the present invention.

The supporting frame 12 comprises a plurality of supporting ribs 121 supported on the light chamber 112 and radially extended from the light source cavity 111 wherein each of the supporting ribs 121 has a height gradually reducing from an inner end to an outer end. The supporting ribs 121 are made of rigid material to substantially support the reflecting member 23 above the light source 22.

The power source 21 has a battery compartment 211 provided at a bottom portion of the protection base 11 for receiving a replaceable battery. In other words, the light source 22 is powered by the replaceable battery so that the portable radial projection light source arrangement is reusable by simply replacing the replaceable battery.

The light source 22 comprises an electric circuit 221 electrically connected to the power source 21 and a luminary element 222 electrically connected to the electric circuit 221 for emitting the light. Accordingly, the luminary element 222, which is a LED, is a dual diode has two terminal electrodes electrically connected to the electric circuit 221 in such a manner that the light is emitted by the luminary element 222 when the two terminal electrodes are electrified.

Practically, different kinds of luminary element 222 can produce different colors of light such as red, blue, or green, such that when red, green, and blue colors are produced at the same time by the luminary elements 222 respectively, the light source 22 is adapted to form a white light.

Alternatively, the luminary element 222 can be a light bulb replaceably mounted on a light bulb socket of the electric circuit 221 in order to emit the light to outside.

The reflecting member 23, having a cone shaped, is supported above the light source 22 in an inverted manner, wherein a base circumferential edge of the reflecting member 23 is securely held at the inner ends of the supporting ribs 121 of the supporting frame 12 in such a manner that an apex of the reflecting member 23 is pointed at the light source 22.

The light reflecting surface 231 of the reflecting member 23 is formed at an outer circumferential surface thereof in such a manner that when the light source 22 emits the light, the reflecting member 23 blocks up the light and reflectedly direct the light to distribute out of the shelter housing 10 in a radial manner, as shown in FIG. 3. Accordingly, the light reflecting surface 231 is inclinedly and upwardly extended from the apex of the reflecting member 23 to the base circumferential edge thereof to form a light reflecting angle $\theta$ with respect to the ground such that the light from the light source 22 is radially reflected within the light reflecting angle $\theta$ to outside.

Figure 2:
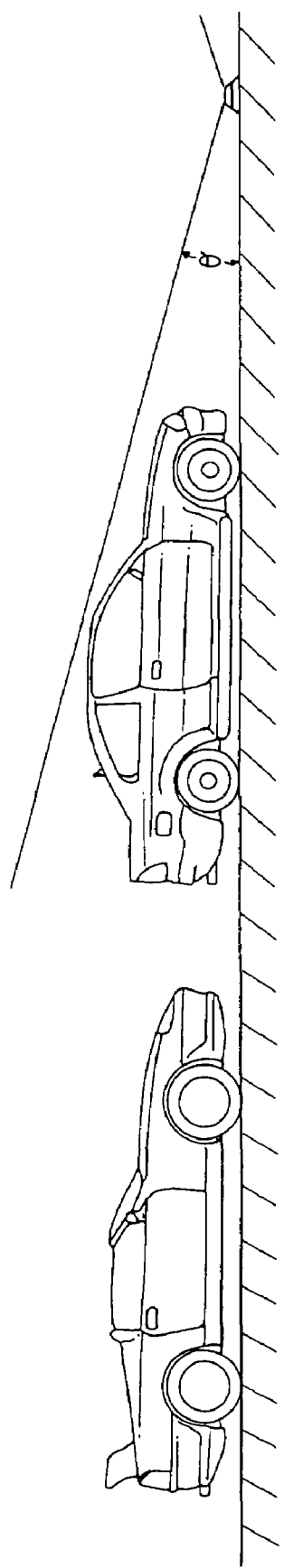
FIG. 2 illustrates a projecting angle of the light radially emitting from the portable radial projection light source arrangement according to the above first preferred embodiment of the present invention

It is worth to mention that the light emitted from the light source 22 is distributed out of the shelter housing 10 in a radial manner, the user will not see the light from the top of the portable radial projection light source arrangement, as shown in FIG. 2. Since the portable radial projection light source arrangement functions as the road flare for alerting the following vehicle passing by, the driver at the following vehicle does not need to see the light from the top of the portable radial projection light source arrangement. However, the light from the portable radial projection light source arrangement is visible from great distances so that the driver at the following vehicle can see the light easily and get the attention from the portable radial projection light source arrangement. In other words, the light from the light source 22 can be seen from far away. Even though the driver drives to a close distance from the portable radial projection light source arrangement, the driver is able to see the light from the light source 22 within the light reflecting angle θ, as shown in FIG. 2.

According to the preferred embodiment, the supporting ribs 121 are made of transparent material so that the light emitted from the light source is capable of passing through the supporting ribs 121 to outside so as to enhance the visibility of the portable radial projection light source arrangement.

The shelter housing 10 further comprises a transparent cover 13 mounted on the protection base 11 to enclose the light chamber 112 so as to protect the illumination unit 20 and the supporting frame 12. Accordingly, the transparent cover 13 is integrally connected with the supporting ribs 121 to form a transparent protecting cap to enclose the light source 22 within the light chamber 112.

Figure 6:
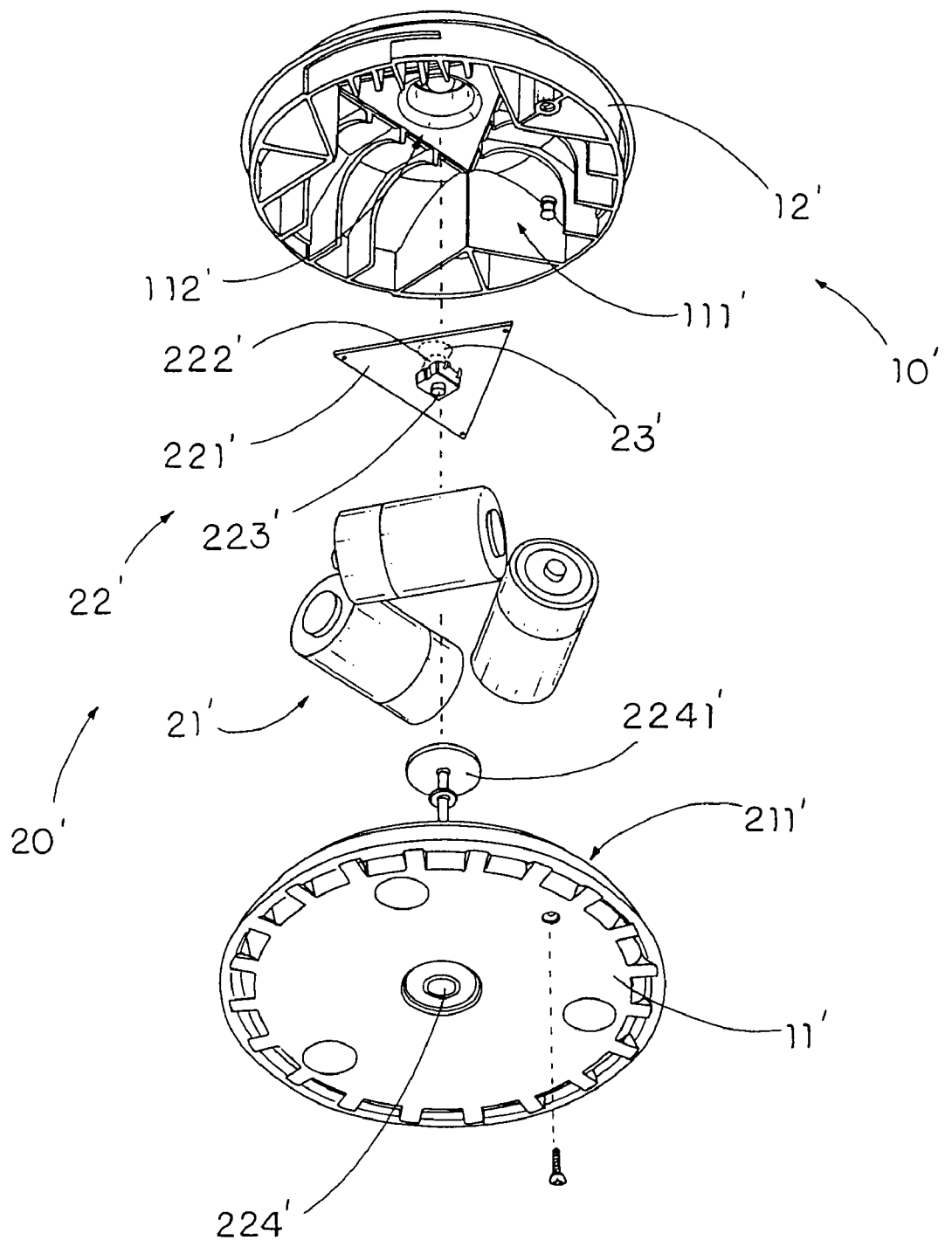
FIG. 6 is a perspective view of a portable radial projection light source arrangement according to a second preferred embodiment of the present invention.
Figure 7:
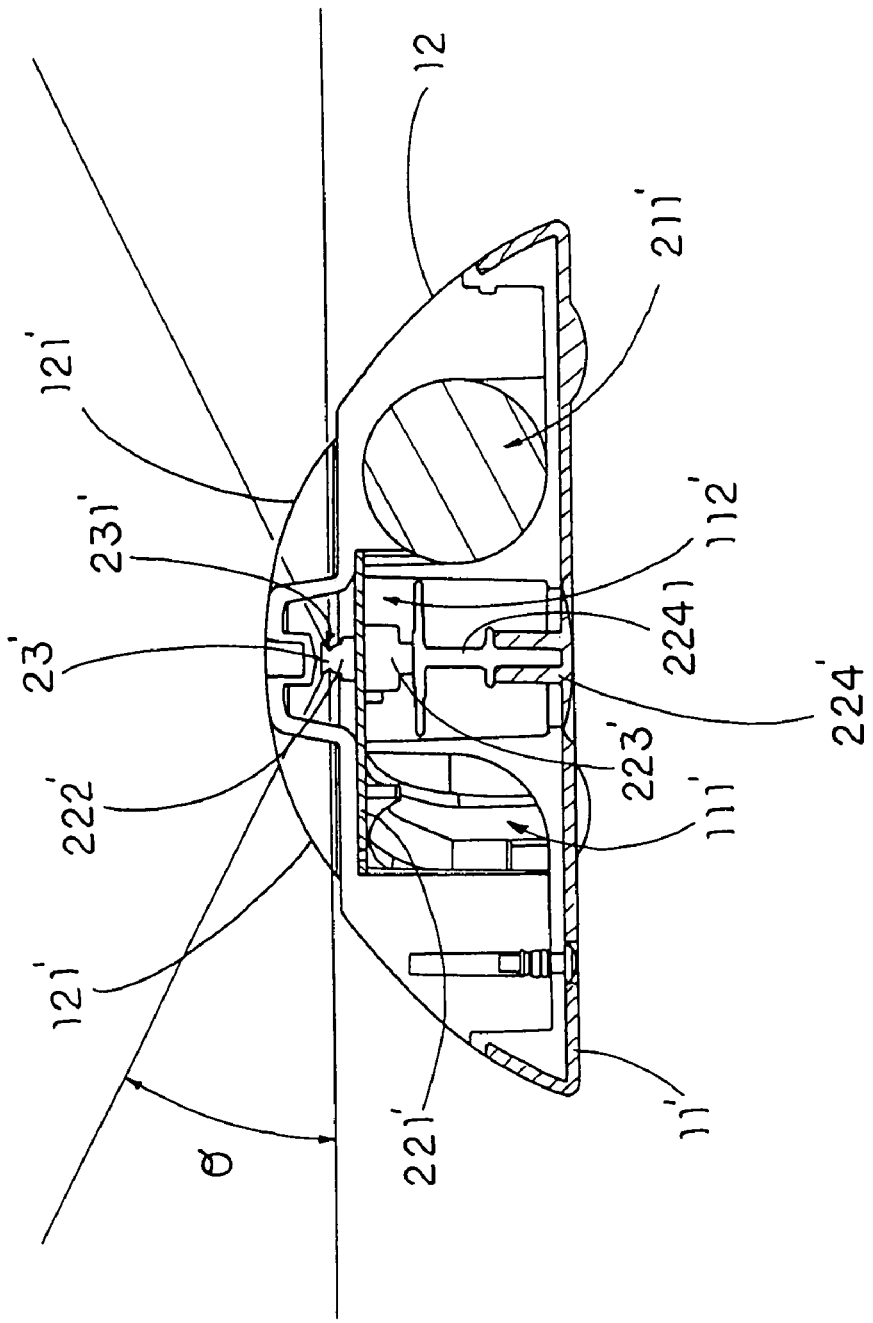
FIG. 7 is a sectional view of the portable radial projection light source arrangement according to the above second preferred embodiment of the present invention.

Referring to FIGS. 6 and 7, a portable radial projection light source arrangement of a second embodiment illustrates an alternative mode of the first embodiment of the present invention, wherein the portable radial projection lighter source arrangement comprises a shelter housing 10' and an illumination unit 20'.

The shelter housing 10' comprises a protection base 11' having a light source cavity 111' and a supporting frame 12' mounted on the protection base 11', wherein the supporting frame 12' comprises a plurality of supporting ribs 121' which are supported at a light chamber 112' of the protection base 11' and are radially extended to define the light chamber 112' for the reflecting member 23' disposing therewithin. Accordingly, each of the supporting ribs 121' is made of transparent material for allowing the light emitted from the light source 22' to pass through the supporting ribs 121' to outside so as to enhance a visibility of said illumination unit 20'.

The illumination unit 20' comprises a power source 21' having a battery compartment 211' supported in the protection base 11', a light source 22' disposed in the light source cavity 111' and electrically connected to the power source 21', and a reflecting member 23' supported at a position coaxially above the light source 22' wherein the reflecting member 23' has a light reflecting surface 231' radially projected from the light source 22' in such a manner that when the light source 22' emits light, the light is radially reflected by the light reflecting surface 231' of the reflecting member 23' to outside.

The light source 22' comprises an electric circuit 221' electrically connected to the power source 21' and a luminary element 222' electrically connected to the electric circuit 221' for emitting the light. Accordingly, the luminary element 222', which is a LED, is a dual diode has two terminal electrodes electrically connected to the electric circuit 221 in such a manner that the light is emitted by the luminary element 222' when the two terminal electrodes are electrified.

As shown in FIG. 7, the reflecting member 23', having an inverted cone shaped, integrally extended from a top end of the luminary element 222' wherein the light reflecting surface 231' is defined at an outer circumferential cone surface to align with the luminary element 222' in such a manner that when the light source 22' emits the light, the light is radially reflected through the reflecting member 23' to outside within the light reflecting angle θ.

Therefore, the light from the portable radial projection light source arrangement is visible from great distances so that the driver at the following vehicle can see the light easily and get the attention from the portable radial projection light source arrangement within the light reflecting angle θ, as shown in FIG. 2

According to the second embodiment, the electric circuit 221', which is embodied as a microprocessor, is preset to control the luminary element 222' for producing a predetermined light effect. Accordingly, the electric circuit 221' is arranged to set the luminary element 222' to provide different modes. The luminary element 222' is capable of selectively providing a regular lighting mode, an extended battery life mode, a fire flicker mode, or a SOS light mode as the light effect in order to provide different lighting signals. Therefore, the user is able to select the desired light effect that the programmable microprocessor of the electric circuit 221' will cycle through all the light mode of the luminary element 222'. In addition, the light source 22' further comprises a low battery indicator 224' electrically connected to the electric circuit 221' in such a manner that when the battery within the battery compartment 211' is below a predetermined level, such as 25% battery life left, the low battery indicator 224' is automatically switched on while the electric circuit 221' is triggered to control the luminary element 222' for reducing the intensity of the light.

The luminary element 222' is a LED having at least two terminal electrodes electrically connected to the electric circuit 221' in such a manner that the light is emitted by the luminary element 222' when the terminal electrodes are electrified. Accordingly, the electric circuit 221' is a circuit board with a predetermined circuitry formed thereon, wherein the LED of the luminary element 222' is imprinted on the electric circuit 221' in such a manner the reflecting member 23' forms as an outer shelter of the luminary element 222' not only for protecting the luminary element 222' but also for radially reflecting the light therefrom.

According to the second embodiment, the light source 22' is lifted up above the battery compartment 211' within the light chamber 112' for enhancing the light emission of the light source 22' of the portable radial projection light source arrangement.

As shown in FIG. 6, the light source 22' further comprises an actuation unit 223' supported underneath the electric circuit 221' to electrically control the luminary element 222', and a switch control 224' provided at a bottom side of the protection base 11' to electrically extend from the actuation unit 223' to selectively switch the luminary element 222' in an on and off manner.

Accordingly, the switch control 224' comprises an actuation arm 2241' extended from the bottom side of the protection base 11' to the actuation unit 223' such that the switch control 224 is arranged to be pushed to switch the luminary element 222' in an on and off manner. It is worth to mention that the portable radial projection light source arrangement is used as a road flare such that the portable radial projection light source arrangement may be accidentally run over. Since the light source 22' is lifted up above the battery compartment 211', it is unsafe to incorporate with electric wires to electrically connect the luminary element 222' with the control switch 224' while connection of the electric wires may be broken accidentally due to the impact or vibration of the portable radial projection light source arrangement. Therefore, the configuration of the switch control 224' ensures the control of the luminary element 222' in an on and off manner.

Figure 8:
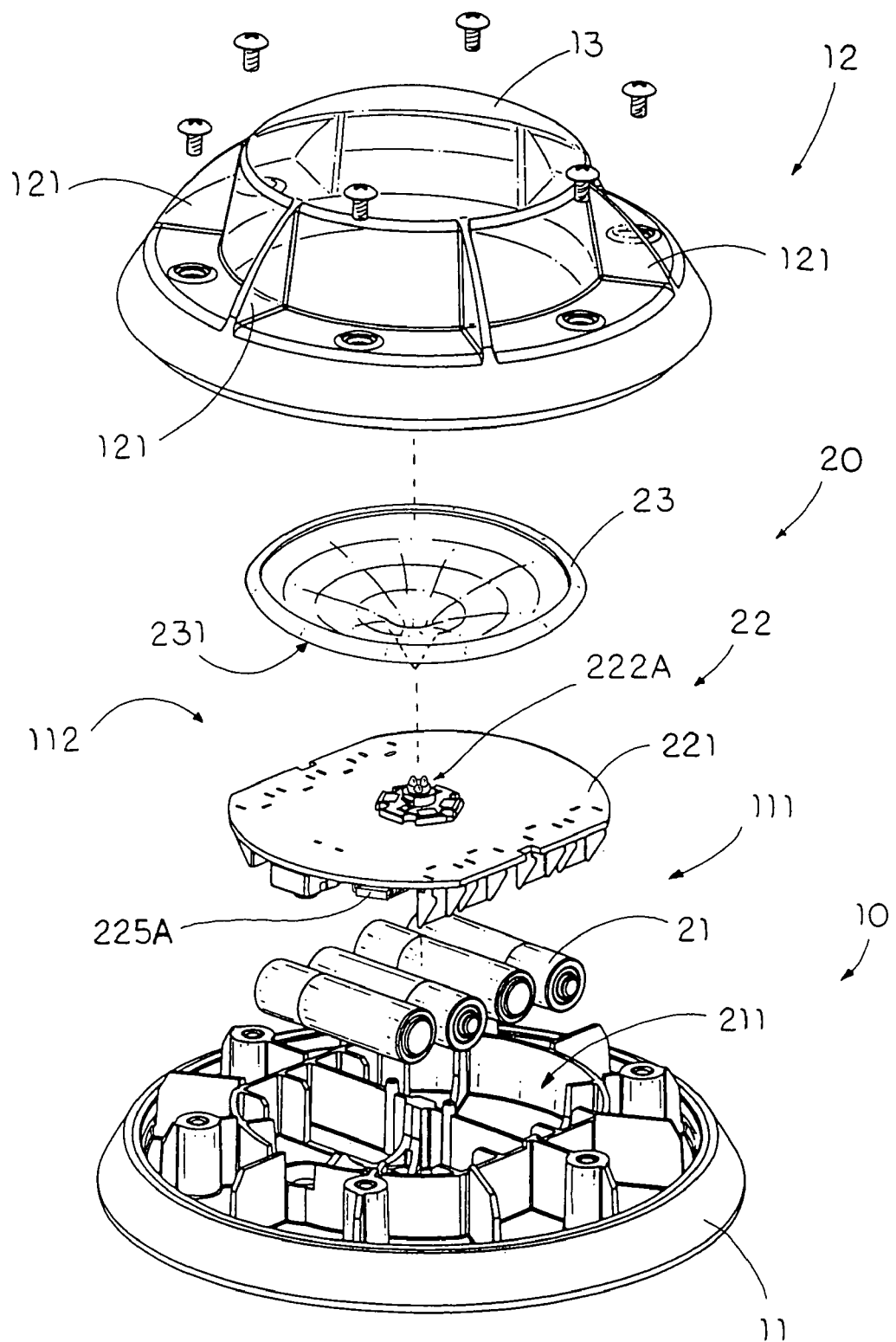
FIG. 8 illustrates an alternative mode of the portable radial projection light source arrangement according to the above first preferred embodiment of the present invention.

FIG. 8 illustrates an alternative mode of the portable radial projection light source arrangement according to the above first preferred embodiment of the present invention, wherein the luminary element 222A comprises a set of LED electrically connected to the electric circuit 221 for generating a light effect. Accordingly, the LED set comprises a red, green and blue color LEDs for respectively generating the primary color of red, green and blue.

The light source 22 further comprises a programmable microprocessor 225A electrically coupling with the electric circuit 221 to selectively control the LED set of the luminary element 222A. Therefore, the possibility of an RGB (red, green, and blue) inclusion could be adjusted to any color by the programmable microprocessor 225A. In other words, the LED set of the luminary element 222A is selectively provided various light effects, such as flashing, so as to enhance the visibility of the portable radial projection light source arrangement. It is worth to mention that two or more LED sets can be incorporated to enhance the light effect of the portable radial projection light source arrangement.

Figure 9:
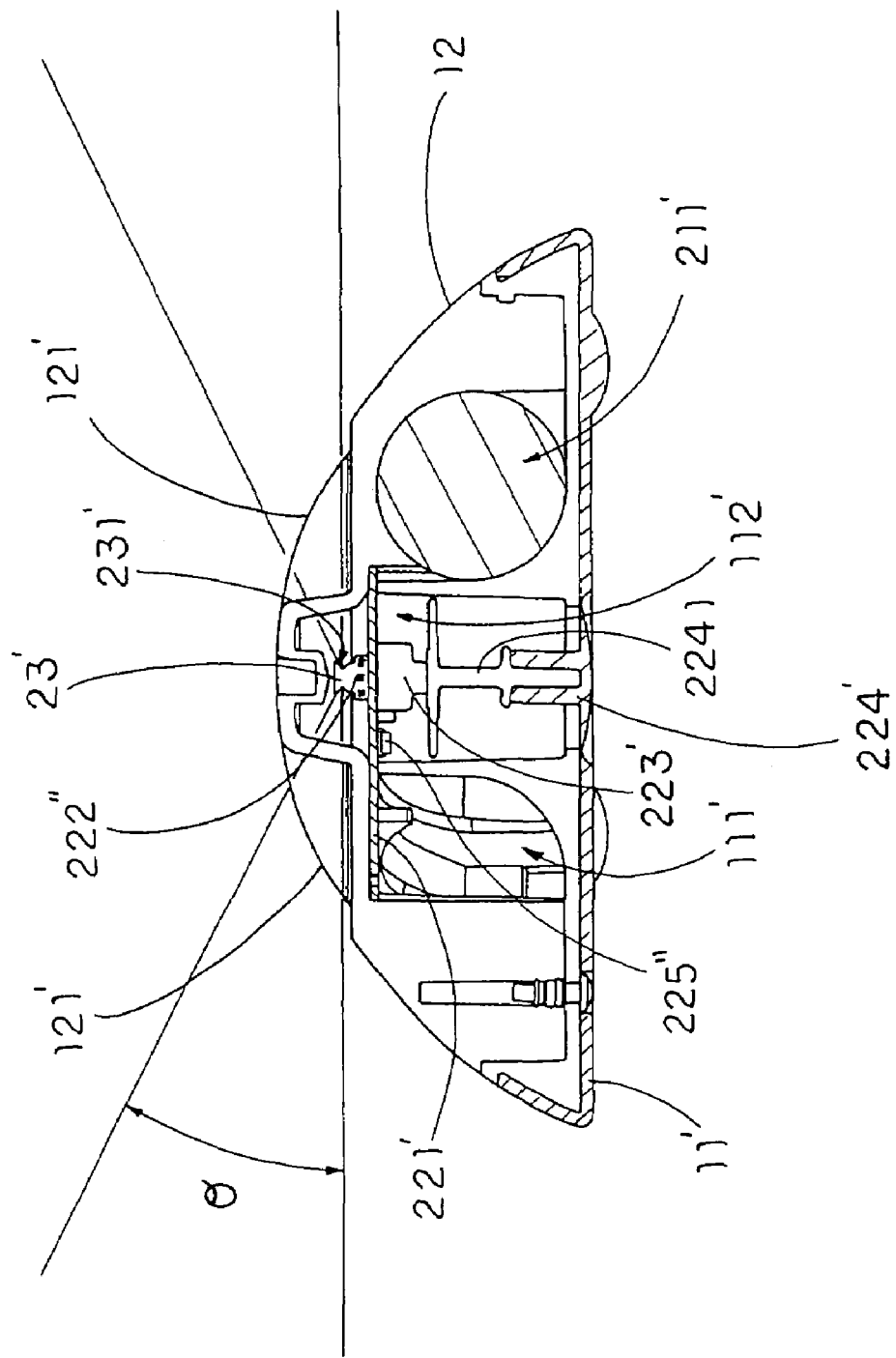
FIG. 9 illustrates an alternative mode of the portable radial projection light source arrangement according to the above second preferred embodiment of the present invention.

Having the RGB inclusion, FIG. 9 illustrates an alternative mode of the portable radial projection light source arrangement according to the above second preferred embodiment of the present invention, wherein the luminary element 222" comprises a set of diodes electrically connected to the electric circuit 221' for generating a light effect. Accordingly, the diodes set comprises a red, green and blue color LED diodes for respectively generating the primary color of red, green and blue.

The light source 22 further comprises a programmable microprocessor 225" electrically coupling with the electric circuit 221' to selectively control the diodes set of the luminary element 222". Therefore, the possibility of an RGB (red, green, and blue) inclusion could be adjusted to any color by the programmable microprocessor 225". In other words, the diodes set of the luminary element 222" is selectively provided various light effect, such as flashing, so as to enhance the visibility of the portable radial projection light source arrangement.

Accordingly, the present invention is adapted to radially project the light from the light source as a road flare for quick use in an emergency. Also, the portable radial projection light source arrangement is adapted to provide various light effects such that the present invention can be used as an entertainment system, such as a decorative party-light device, to enhance the entertaining atmosphere.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A portable radial projection light source arrangement, comprising:
a shelter housing comprising a protection base having a light source cavity therein, and a supporting frame mounted on said protection base, wherein said supporting frame comprises a plurality of supporting ribs radially extended from said light source cavity; and
an illumination unit comprising a power source supported in said protection base, a light source disposed in said light source cavity and electrically connected to said power source, and a reflecting member supported by said supporting ribs at a position coaxially above said light source, wherein said reflecting member has a light reflecting surface radially projected from said light source in such a manner that when said light source emits light, said light is radially reflected by said light reflecting surface of said reflecting member to outside, wherein each of said supporting ribs is made of transparent material for allowing said light emitted from said light source to pass through said supporting ribs to outside so as to enhance a visibility of said illumination unit.

2. A portable radial projection light source arrangement, comprising:
a shelter housing comprising a protection base having a light source cavity therein, and a supporting frame mounted on said protection base, wherein said supporting frame comprises a plurality of supporting ribs radially extended from said light source cavity; and
an illumination unit comprising a power source supported in said protection base, a light source disposed in said light source cavity and electrically connected to said power source, and a reflecting member supported at a position coaxially above said light source, wherein said reflecting member has a light reflecting surface radially projected from said light source in such a manner that when said light source emits light, said light is radially reflected by said light reflecting surface of said reflecting member to outside, wherein each of said supporting ribs is made of transparent material for allowing said light emitted from said light source to pass through said supporting ribs to outside so as to enhance a visibility of said illumination unit, said supporting ribs radially extending to define a light chamber at a position that said light source cavity is formed at a center of said light chamber while said reflecting member is disposed within said light chamber.

3. The portable radial projection light source arrangement, as recited in claim 2, wherein said reflecting member, having an inverted cone shaped, is integrally extended from a top end of said light source, wherein said light reflecting surface is defined at an outer circumferential cone surface to align with said light source for reflecting said light in a radial manner.

4. A portable radial projection light source arrangement, comprising:
a shelter housing comprising a protection base having a light source cavity therein, and a supporting frame mounted on said protection base, wherein said supporting frame comprises a plurality of supporting ribs radially extended from said light source cavity; and
an illumination unit comprising a power source supported in said protection base, a light source disposed in said light source cavity and electrically connected to said power source, and a reflecting member supported at a position coaxially above said light source, wherein said reflecting member has a light reflecting surface radially projected from said light source in such a manner that when said light source emits light, said light is radially reflected by said light reflecting surface of said reflecting member to outside, wherein each of said supporting ribs is made of transparent material for allowing said light emitted from said light source to pass through said supporting ribs to outside so as to enhance a visibility of said illumination unit, wherein said reflecting member, having an inverted cone shaped, is integrally extended from a top end of said light source, wherein said light reflecting surface is defined at an outer circumferential cone surface to align with said light source for reflecting said light in a radial manner.

* * * * *